(12) United States Patent
Thomas et al.

(10) Patent No.: US 10,388,848 B2
(45) Date of Patent: Aug. 20, 2019

(54) DONOR- OR ACCEPTOR-BASED SPIN QUBITS WITH ISOTOPICALLY PURIFIED MATERIALS

(71) Applicant: Intel Corporation, Santa Clara, CA (US)

(72) Inventors: Nicole K. Thomas, Portland, OR (US); James S. Clarke, Portland, OR (US); Jessica M. Torres, Portland, OR (US); Lester Lampert, Portland, OR (US); Ravi Pillarisetty, Portland, OR (US); Hubert C. George, Portland, OR (US); Kanwaljit Singh, Rotterdam (NL); Jeanette M. Roberts, North Plains, OR (US); Roman Caudillo, Portland, OR (US); Zachary R. Yoscovits, Beaverton, OR (US); David J. Michalak, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/924,410

(22) Filed: Mar. 19, 2018

(65) Prior Publication Data

US 2019/0044045 A1 Feb. 7, 2019

(51) Int. Cl.
| | |
|---|---|
| *H01L 39/02* | (2006.01) |
| *H01L 39/04* | (2006.01) |
| *H01L 39/22* | (2006.01) |
| *H01L 39/24* | (2006.01) |

(Continued)

(52) U.S. Cl.
CPC ........... *H01L 39/025* (2013.01); *G06N 10/00* (2019.01); *H01L 39/045* (2013.01); *H01L 39/223* (2013.01); *H01L 39/249* (2013.01); *H01L 39/2493* (2013.01); *H03K 17/92* (2013.01)

(58) Field of Classification Search
None
See application file for complete search history.

(56) References Cited

U.S. PATENT DOCUMENTS

| | | | |
|---|---|---|---|
| 8,816,325 B2* | 8/2014 | Schenkel | H01L 29/66984 257/14 |
| 2018/0107938 A1* | 4/2018 | Morello | G01N 24/10 |
| 2019/0043968 A1 | 2/2019 | Lampert et al. | |

OTHER PUBLICATIONS

"Interfacing spin qubits in quantum dots and donors—hot, dense, and coherent," Vandersypen et al., npj Quantum Information (2017)3:34; Published online Sep. 6, 2017, 10 pages.

(Continued)

*Primary Examiner* — Jeffery S Zweizig
(74) *Attorney, Agent, or Firm* — Patent Capital Group

(57) ABSTRACT

Embodiments of the present disclosure describe use of isotopically purified materials in donor- or acceptor-based spin qubit devices and assemblies. An exemplary spin qubit device assembly may include a semiconductor host layer that includes an isotopically purified material, a dopant atom in the semiconductor host layer, and a gate proximate to the dopant atom. An isotopically purified material may include a lower atomic-percent of isotopes with nonzero nuclear spin than the natural abundance of those isotopies in the non-isotopically purified material. Reducing the presence of isotopes with nonzero nuclear spin in a semiconductor host layer may improve qubit coherence and thus performance of spin qubit devices and assemblies.

25 Claims, 9 Drawing Sheets

(51) Int. Cl.
  *H03K 17/92*   (2006.01)
  *G06N 10/00*   (2019.01)

(56) References Cited

OTHER PUBLICATIONS

"Will Silicon Save Quantum Computing," Lo et al., IEEE Spectrum, Jul. 31, 2014, retrieved from internet on Jul. 16, 2018 https://spectrum.iee.org/semiconductors/materials/will-silicon-save-quantum-computing,11 pages.
"A single-atom electron spin quibit in silicon," Pla et al., Nature, vol. 489, Sep. 27, 2012, pp. 541-545.
"A photonic platform for donor spin quibits in silicon," Morse et al., Sci. Adv. 2017;3:e1700930, Jul. 26, 2017, 10 pages.
"Si nuclear spins as a resource for donor spin quibits in silicon," Wolfowicz et al., NewJ.Phys.19(2016)023021, 8 pages.
"Electron spin relaxation times of phosphorus donors in silicon," Tyryshkin et al., Physical Review B 68, 193207 (2003) 4 pages.

\* cited by examiner

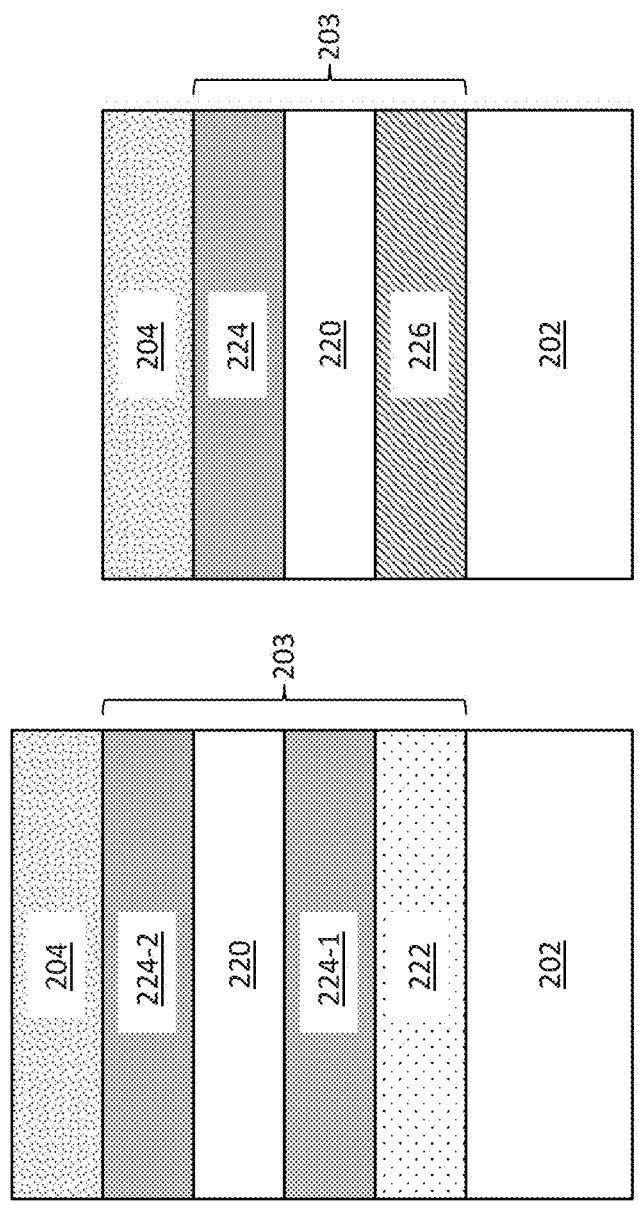

DONOR- OR ACCEPTOR-BASED SPIN QUBITS WITH ISOTOPICALLY PURIFIED MATERIALS

TECHNICAL FIELD

This disclosure relates generally to the field of quantum computing, and more specifically, to donor- or acceptor-based spin qubit devices and to methods of manufacturing thereof.

BACKGROUND

Quantum computing refers to the field of research related to computation systems that use quantum-mechanical phenomena to manipulate data. These quantum-mechanical phenomena, such as superposition (in which a quantum variable can simultaneously exist in multiple different states) and entanglement (in which multiple quantum variables have related states irrespective of the distance between them in space or time), do not have analogs in the world of classical computing.

Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Compared to well-established and thoroughly researched classical computers, quantum computing is still in its infancy, with the highest number of qubits in a solid-state quantum processor currently being below 100. One of the main challenges resides in protecting qubits from decoherence so that they can stay in their information-holding states long enough to perform the necessary calculations and read out the results.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 3A-3D provide cross-section illustrations of exemplary dopant atom stacks in which a dopant atom of a dopant-based spin qubit device may be implanted, according to various embodiments of the present disclosure.

DETAILED DESCRIPTION

Overview

Figure 1:
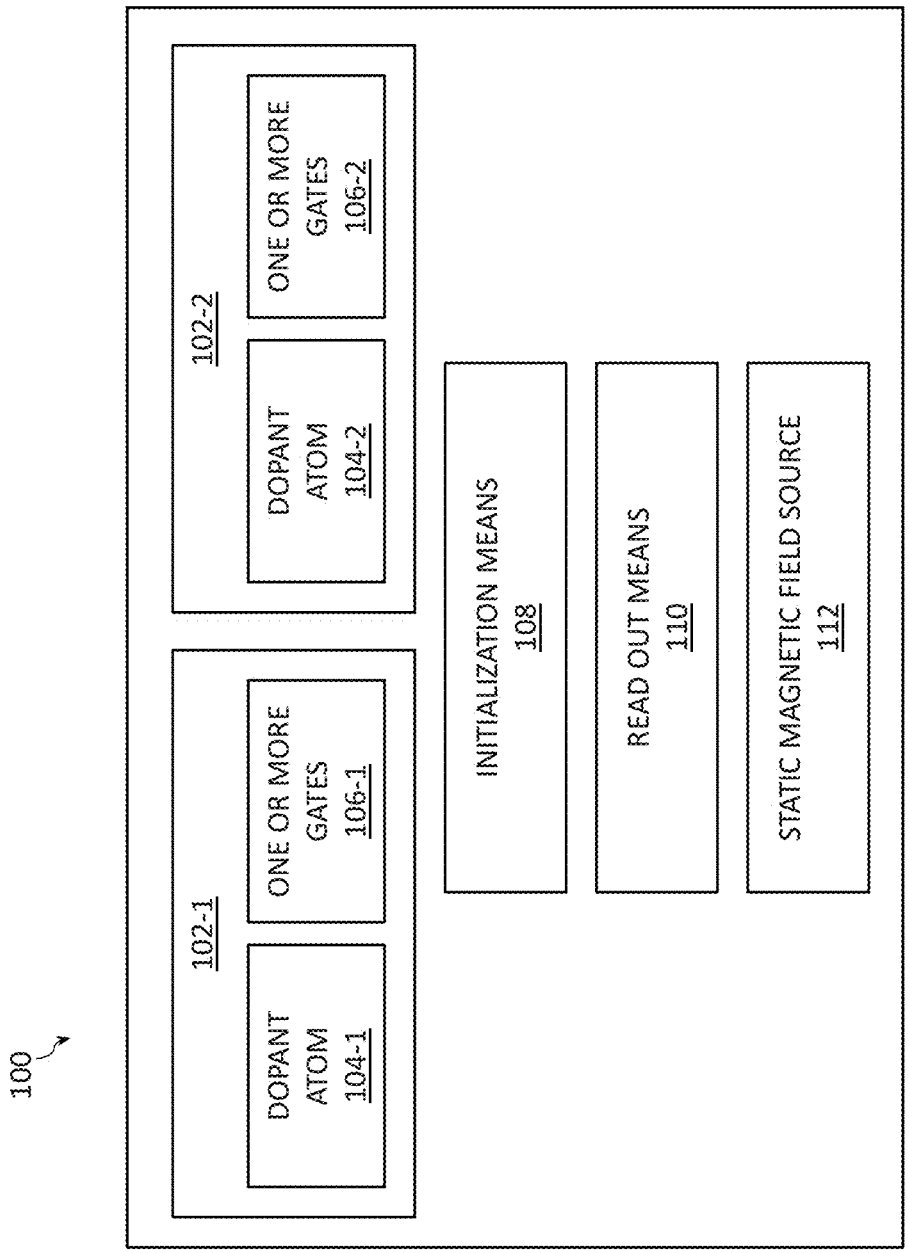
FIG. 1 provides a schematic illustration of an exemplary spin qubit device assembly with dopant-based spin qubit devices, according to some embodiments of the present disclosure.

As briefly described above, quantum computing, or quantum information processing, refers to the field of research related to computation systems that use quantum-mechanical phenomena to manipulate data. One example of quantum-mechanical phenomena is the principle of quantum superposition, which asserts that any two or more quantum states can be added together, i.e. superposed, to produce another valid quantum state, and that any quantum state can be represented as a sum of two or more other distinct states. Quantum entanglement is another example of quantum-mechanical phenomena. Entanglement refers to groups of particles being generated or interacting in such a way that the state of one particle becomes intertwined with that of the others. Furthermore, the quantum state of each particle cannot be described independently. Instead, the quantum state is given for the group of entangled particles as a whole. Yet another example of quantum-mechanical phenomena is sometimes described as a "collapse" because it asserts that when we observe (measure) particles, we unavoidably change their properties in that, once observed, the particles cease to be in a state of superposition or entanglement (i.e. by trying to ascertain anything about the particles, we collapse their state).

Put simply, superposition postulates that a given particle can be simultaneously in two states, entanglement postulates that two particles can be related in that they are able to instantly coordinate their states irrespective of the distance between them in space and time, and collapse postulates that when one observes a particle, one unavoidably changes the state of the particle and its' entanglement with other particles. These unique phenomena make manipulation of data in quantum computers significantly different from that of classical computers (i.e. computers that use phenomena of classical physics). Therefore, both the industry and the academics continue to focus on a search for new and improved physical systems whose functionality could approach that expected of theoretically designed qubits.

Physical systems for implementing qubits that have been explored until now include e.g. superconducting qubits, vacancy center (VC)-based spin qubits, quantum dot spin qubits, donor-based spin qubits etc. Out of the various physical implementations of qubits, donor-based spin qubits are promising candidates for building a quantum computer because they have a potential for relatively long coherent times, compared to other types of qubits, and are compatible with current semiconductor manufacturing processes. In semiconductor physics, a donor refers to a dopant atom added as an impurity to a host crystal, the donor being an atom that has more valence electrons than the atoms of the host crystal so that, when added to the host crystal, it can contribute or donate the extra valence electrons by becoming ionized and positively charged. For example, an atom of column V of the periodic table (i.e. an atom having 5 valence electrons), such as e.g. phosphorus (P), arsenic (As), antimony (Sb), or bismuth (Bi), substituting a regular atom of a silicon or a germanium crystalline lattice (i.e. host atoms having 4 valence electrons, from column IV of the periodic table) is a donor because it has one or more valence electrons, compared to silicon or germanium, which valence electrons can be detached and added to the conduction band of the crystal. Similarly, an acceptor is a dopant atom that may be added as an impurity to a host crystal, the acceptor being an atom that has less valence electrons than the atoms of the host crystal. For example, an atom of column III of the periodic table (i.e. an atom having 3 valence electrons), such as e.g. boron (B) or aluminum (Al), substituting a regular atom of a silicon or a germanium crystalline lattice is an acceptor because it has one or more valence electrons, compared to silicon or germanium. Turning to the donor atoms as an example, a donor atom possesses at least one extra electron than the atoms of the host crystal and the extra electron tends to remain bound to the donor atom at low temperature. Such a single, bound electron has both electron and nuclear spins of ½ that are able to form qubits. Hence, a donor-based spin qubit device typically refers to a single dopant atom implanted in a semiconductor host material, e.g. a single phosphorous atom implanted in a silicon or a germanium substrate.

Donor-based spin qubits have been shown to operate with relatively long coherence times, even up to seconds. However, further enhancement of qubit properties are always desirable.

Embodiments of the present disclosure relate to spin qubit device assemblies that utilize dopant-based spin qubits, i.e. spin qubit devices which operate by including a dopant atom, e.g. a donor or an acceptor atom, in a semiconductor host layer. In particular, some embodiments of the present disclosure describe use of isotopically purified materials in donor- or acceptor-based (i.e., dopant-based) spin qubit devices and assemblies. An exemplary spin qubit device assembly may include a semiconductor host layer that includes an isotopically purified material, a dopant atom in the semiconductor host layer, and a gate proximate to the dopant atom. As used herein, an "isotopically purified material" is a material whose composition of isotopes with nonzero nuclear spin is less than the natural abundance of those isotopes in the material. In other words, an isotopically purified material may include a lower atomic-percent of isotopes with nonzero nuclear spin than the natural abundance of those isotopies in the non-isotopically purified material. It should be noted that a presence of a dopant atom or a plurality of such individual dopant atoms forming different spin qubit devices in such a material still qualifies a material to be referred to as an "isotopically purified material" as long as even with such dopant atoms the composition of isotopes with nonzero nuclear spin is less than the natural abundance of those isotopes in the material. Isotopes with nonzero nuclear spin may cause a reduction of the electron spin coherence time in a spin qubit device assembly due to hyperfine coupling of the electron spin to the nuclear spin bath and intrinsic interactions between nuclear spins. Hence, reducing the presence of these isotopes in a semiconductor host layer may improve qubit coherence and thus performance of spin qubit devices and assemblies.

The semiconductor host layer of an isotopically purified material in which a dopant atom is to be provided may be part of a stack of any number of one or more layers (i.e. when the stack includes one layer then the semiconductor host layer as described herein is the only layer, and otherwise the stack may include other layers in addition to the semiconductor host layer, e.g. buffer and/or barrier layers as described herein). Because a dopant atom is provided in such a stack, the stack may be referred to as a "dopant atom stack."

In order to provide substantially lossless connectivity to, from, and between the qubits, electrically conductive portions of various quantum circuit elements described herein (e.g. the electrodes described herein) may be made from one or more superconductors. However, some or all of these electrically conductive portions could be made from electrically conductive materials which are not superconductive. In the following, unless specified otherwise, reference to an electrically conductive material or an electrically conductive circuit element of a quantum circuit implies that a superconductor may, but does not have to, be used. Furthermore, materials described herein as "superconductors" (which may be described, interchangeably as "superconductive/superconducting materials") may refer to materials, including alloys of materials, which exhibit superconducting behavior at typical qubit operating conditions, e.g. materials which exhibit superconducting behavior at very low temperatures at which qubits typically operate, but which do not necessarily exhibit such behavior at higher temperatures, e.g. at room temperatures. Some examples of materials which may be used as superconductors described herein include aluminum (Al), niobium (Ni), tin (Sn), titanium (Ti), osmium (Os), zinc (Zn), molybdenum (Mo), tantalum (Ta), vanadium (V), composites or alloys of such materials, e.g. niobium-titanium, niobium-aluminum, or niobium-tin, or nitrides of such materials, e.g. niobium nitride (NbN), titanium nitride (TiN), niobium titanium nitride (NbTiN), all of which are particular types of superconductors at qubit operating temperatures, as well as any combinations of any of these materials.

While some descriptions of various embodiments of the present disclosure are provided with reference to donor-based spin qubit devices using phosphorous as donor atoms implanted in a semiconductor host layer of silicon, teachings of the present disclosure are equally applicable to donor-based spin qubit devices using any type of donor atoms other than phosphorous implanted in any suitable semiconductor host layer other than silicon, as well as to dopant-based spin qubit devices using acceptors as dopant atoms. Furthermore, the quantum circuit assemblies described herein may implement different types of qubits at the same time, e.g. hybrid semiconducting-superconducting quantum circuits may implement dopant-based spin qubits in combination with superconducting qubits, or other hybrid quantum circuits may implement dopant-based spin qubits in combination with quantum dot qubits. The terms "qubits" and "qubit devices" may be used interchangeably.

Dopant-based spin qubit device assemblies with dopant atoms integrated in a semiconductor host layer according to any of the embodiments described herein may be implemented in one or more components associated with an integrated circuit (IC) or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. The accompanying drawings are not necessarily drawn to scale. For convenience, if a collection of drawings designated with different letters are present, e.g. FIGS. 3A-3D, such a collection may be referred to herein without the letters, e.g. as "FIG. 3."

In the drawings, some schematic illustrations of exemplary structures of various devices and assemblies described herein may be shown with precise right angles and straight lines, but it is to be understood that such schematic illustrations may not reflect real-life process limitations which may cause the features to not look so "ideal" when any of the structures described herein are examined using e.g. scanning electron microscopy (SEM) images or transmission electron microscope (TEM) images. In such images of real structures, possible processing defects could also be visible, such as e.g. not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. The accompanying drawings are not necessarily drawn to scale.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

While the disclosure may use the singular term "layer," the term "layer" should be understood to refer to assemblies that may include multiple different material layers.

In the following detailed description, various aspects of the illustrative implementations may be described using terms commonly employed by those skilled in the art to convey the substance of their work to others skilled in the art. For example, the terms "oxide," "carbide," "nitride," etc. may refer to compounds containing, respectively, oxygen, carbon, nitrogen, etc. The terms "substantially," "close," "approximately," "near," and "about," may generally refer to being within +/−20% of a target value based on the context of a particular value as described herein or as known in the art. Similarly, terms indicating orientation of various elements, such as e.g. "coplanar," "perpendicular," "orthogonal," "parallel," or any other angle between the elements, may generally refer to being within +/−5-10% of a target value based on the context of a particular value as described herein or as known in the art.

Still further, while the present disclosure may include references to microwave signals, this is done only because current qubits are designed to work with such signals because the energy in the microwave range is higher than thermal excitations at the temperature at which the qubits are typically operated. In addition, techniques for the control and measurement of microwaves are well known. For these reasons, typical frequencies of qubits are in 1-10 GHz, e.g. in 3-8 GHz, range, in order to be higher than thermal excitations, but low enough for ease of microwave engineering. However, advantageously, because excitation energy of qubits is controlled by the circuit elements, qubits can be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

Quantum Computing and Dopant-based Spin Qubits

In order to highlight the advantages offered by novel methods for fabricating dopant-based spin qubit devices described herein as well as the resulting devices and assemblies, it would be helpful to first describe various implementations of quantum circuits/assemblies with dopant-based spin qubits that could be included in a qubit die. FIG. 1 provides a schematic illustration of an exemplary quantum circuit assembly 100, in particular a spin qubit device assembly, with dopant-based spin qubits, according to some embodiments of the present disclosure.

As shown in FIG. 1, an exemplary spin qubit device assembly 100 may include two or more dopant-based spin qubits 102, where reference numerals following after a dash, such as e.g. qubit 102-1 and 102-2 indicate different instances of the same or analogous element. Each of the dopant-based spin qubits 102 may include a respective dopant atom 104 provided in a layer of an otherwise intrinsic semiconductor material and one or more gates 106. The spin qubit device assembly 100 may further include initialization means 108 for initializing states of one or more of the qubits 102, read out means for determining (i.e. reading out) states of one or more of the qubits 102, as well as, optionally a static magnetic field source 112 for helping create clearly resolvable electron spin up and down states of one or more of the qubits 102.

A donor-based spin qubit 102 may be formed by implanting a group V donor atom 104, e.g. a phosphorous atom, into a group IV layer of a substantially intrinsic semiconductor material (referred to herein as a "semiconductor host layer"), e.g. a layer of silicon, which layer may be seen as a part of a semiconductor substrate on which the spin qubit device assembly 100 may be implemented. The donor atom 104 may possess one more electron than the atoms of the semiconductor host layer and the extra electron may tend to remain bound to the donor atom 104 at low temperature. The single, bound electron has both electron and nuclear spins ½ that define the qubit 102. The one or more gates 106, each including a gate electrode, typically made out of metal, and a gate dielectric between the gate electrode and the semiconductor layer, may be provided proximate the donor atom 104, as well as, optionally, substantially directly above the donor atom for tuning the electrochemical potential landscape of the spin qubit device assembly 100. For example, if sample uniformity is poor, e.g. as a result of manufacturing variations or lack of adequate control, there may be one or more additional dopant atoms present in locations where they are not supposed to be present, more than one gate 106 can be used to compensate for the non-uniformities. In general, applying voltages to the one or more gates 106 of a given qubit allows altering the wavefunction of the bound, donor electron of the donor atom 104 of that qubit and tune the electrochemical potential of the donor atom 104, which may e.g. be done to control qubit interactions, e.g. to allow the first qubit 102-1 to couple or interact with the second qubit 102-2, or to prevent or minimize such interaction.

The initialization means 108 may include means for generating an oscillating magnetic field that can reach the donor atoms 104 and control qubit transitions between spin up and down, i.e. initialize the state of the donor atoms 104. In some embodiments, a magnet line such as e.g. a microwave transmission line may be used as the initialization means 108. As used herein, a "magnet line" refers to a magnetic field-generating structure to influence (e.g., change, reset, scramble, or set) the spin states of donor atoms 104. One example of a magnet line, as discussed herein, is a microwave transmission line that may be implemented as a conductive pathway that is proximate to a donor atom to be influenced and that is selectively conductive of a current pulse that generates a magnetic field to influence a spin state of said donor atom. Providing microwave pulses in such a line generates an oscillating magnetic field. Providing at least a portion of such a line in the vicinity of a donor atom, e.g. so that a portion of the transmission line implementing the initialization means 108 is at a distance between about 0 and 2000 nanometers from the dopant atom 104, e.g. between about 5 and 1000 nanometers or between about 10 and 500 nanometers, may generate an oscillating magnetic field to control a spin state of the dopant-based spin qubit 102. In some embodiments, a magnet line implementing an instance of the initialization means 108 may conduct a pulse to reset (or "scramble") nuclear and/or electron spins of any of the dopant atoms 104. In some embodiments, a magnet line implementing an instance of the initialization means 108 may conduct a pulse to initialize an electron in a donor atom to a particular spin state. In some embodiments, a magnet line implementing an instance of the initialization means 108 may conduct current to provide a continuous, oscillating magnetic field to which the spin of a qubit may couple. In various further embodiments, a magnet line implementing an instance of the initialization means 108 may provide any suitable combination of these embodiments, or any other appropriate functionality.

In some embodiments, a magnet line implementing an instance of the initialization means 108 may be formed of a conductive material, and may be used to conduct current pulses that generate magnetic fields to influence the spin states of one or more of the dopant atoms 104. In some embodiments, such a magnet line may be formed of a superconductor, such as aluminum. In other embodiments, such a magnet line may be formed of a non-superconducting conductive material, such as copper.

In some embodiments, different instances of the initialization means 108, e.g. individual microwave transmission lines, may be used to control the spin states of individual dopant-based spin qubits 102. In other embodiments, one instance of the initialization means 108, e.g. a single microwave transmission line, may be used to control the spin states of two or more different qubits 102.

In various embodiments, various conductive circuit elements included in a spin qubit device assembly such as the spin qubit device assembly 100, e.g. microwave transmission line(s) that may be used to implement the initialization means 108 or, in general, different magnet lines, could have different shapes and layouts. In general, the term "line" as used herein in context of magnet lines or microwave transmission lines does not imply straight lines, unless specifically stated so. For example, some magnet or microwave transmission line(s) or parts thereof may comprise more curves, wiggles, and turns while other magnet or microwave transmission lines or parts thereof may comprise less curves, wiggles, and turns, and some magnet or microwave transmission lines or parts thereof may comprise substantially straight lines.

The read out means 110 may include any suitable structures or devices for determining spin states of different qubits 102. Various means for reading out qubit states of dopant-based spin qubits are known in the art, all of which being within the scope of the present disclosure. For example, the qubit state readout may be accomplished by methods such as electron tunneling or pulsed magnetic resonance. In some embodiments, different instances of the read out means 110, e.g. individual single electron transistors (SETs), in case read out by electron tunneling is employed, may be used to read out the spin states of individual qubits 102. In other embodiments, one instance of the read out means 110, e.g. a single SET, may be used to read out the spin states of two or more different qubits 102, e.g. to read out different qubits sequentially.

The static magnetic field source 112 may, optionally, be used to provide a static magnetic field in-plane with the substrate on which the qubits 102 are implemented, which may be applied for Zeeman spin splitting. Such a static magnetic field may help create clearly resolvable electron spin up and down states of one or more of the qubits 102. The oscillating magnetic field generated by the initialization means 108 may be perpendicular in applied direction to the in-plane magnetic field generated by the static magnetic field source 112. Both magnetic fields may be applied to a given spin qubit 102 substantially simultaneously.

In some embodiments, the static magnetic field source 112 may be implemented as a magnet line formed of a magnetic material. For example, a magnetic material (such as cobalt) may be deposited in a trench in e.g. a suitable insulating material to provide a permanent magnetic field in the spin qubit device assembly 100. In various embodiments, the static magnetic field source 112 may be implemented as e.g. a permanent magnet, superconducting magnet, and/or electromagnetic coil.

The qubits 102, the initialization means 108, and the read out means 110 of the spin qubit device assembly 100 may be provided on, over, or at least partially embedded on a substrate/die (not specifically shown in FIG. 1) having a semiconductor host layer (also not specifically shown in FIG. 1) provided over or on at least portions of the substrate, so that the dopant atoms 104 are included in such a semiconductor host layer.

Exemplary Dopant-based Spin Qubit Device Assemblies with Isotopically Purified Materials Using isotopically purified materials as described herein may create unique spin qubit device assemblies, an example of which is illustrated with reference to FIG. 2, providing a cross-section illustrations of an exemplary spin qubit device assembly 200 according to some embodiments of the present disclosure.

Figure 2:
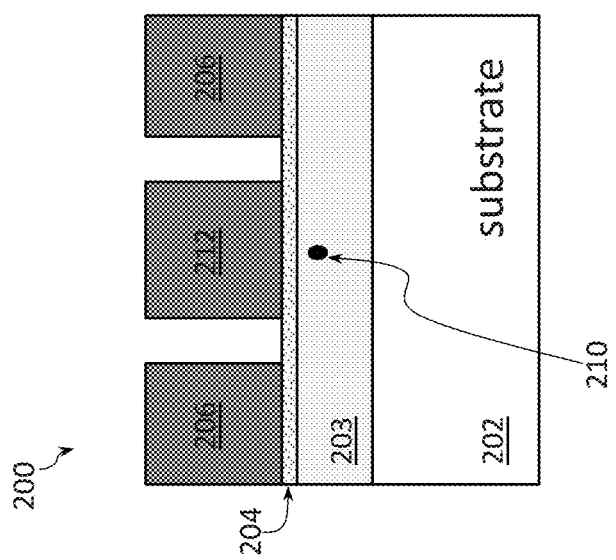
FIG. 2 provides a cross-section illustration of an exemplary spin qubit device assembly implementing dopant-based spin qubit devices with one or more isotopically purified materials, according to various embodiments of the present disclosure.

As shown in FIG. 2, a spin qubit device assembly 200 may include a substrate 202 having a dopant atom stack 203 provided thereon, where the dopant atom stack 203 may include one or more layers of semiconductor materials, described in greater detail with reference to FIGS. 3A-3D, at least one of which layers is a semiconductor host layer 220 (not shown in FIG. 2 but shown in FIGS. 3A-3D) in which dopant atoms for forming dopant-based spin qubits are to be implanted. FIG. 2 schematically illustrates a dopant atom 210 that may be an example of the dopant atom 104 shown in FIG. 1, forming a dopant-based spin qubit such as the dopant-based spin qubit device 102 shown in FIG. 1. Thus, FIG. 2 may be viewed as providing an illustration of a single dopant-based spin qubit device.

As also shown in FIG. 2, the spin qubit device assembly 200 may include one or more gates, typically a plurality of gates, each formed of a gate dielectric 204 and a respective gate electrode. In particular, the spin qubit device assembly 200 illustrates an embodiment showing a pair of the gate electrodes 206 provided at a distance from one another and a center gate electrode 212 substantially above the dopant atom 210. The gates formed by the gate electrodes 206/212 are examples of the one or more gates 106 shown in FIG. 1. In some embodiments, the distance between the pair of gate electrodes 206 may be between about 10 and 400 nanometers, including all values and ranges therein, e.g. between about 20 and 200 nanometers or between about 40 and 100 nanometers. In various further embodiments of the spin qubit device assembly 200, one or more of the gate electrodes 206/212 shown in FIG. 2 may be absent. For example, in some embodiments, the spin qubit device assembly 200 may include the gate electrode 212 but none of the gate electrodes 206 shown in FIG. 2; in other embodiments, the spin qubit device assembly 200 may include only one of the gate electrodes 206, in which embodiments the gate electrode 212 may either be present or absent. When both of the gate electrodes 206 are present, in some embodiments, the dopant atom 210 may be located substantially in the middle between the first and second electrodes 206. When the center gate electrode 212 is present, in some embodiments, the dopant atom 210 may be located below the center gate electrodes 212. When the center gate electrode 212 is present, such an electrode may be provided by depositing the gate metal material after the dopant atom 210 has been implanted. Such a center gate electrode 212 may serve to modify the electrochemical potential and wavefunction of the donor atom, below.

Although not specifically shown in FIG. 2, each of the gates formed by the gate electrodes 206 may further include a hardmask. The hardmask may be formed of silicon nitride, silicon carbide, or another suitable material. The gate electrode 206 may be disposed between such a hardmask and the gate dielectric 204, and the gate dielectric 204 may be disposed between the gate electrode 206 and the dopant atom stack 203. Although not specifically shown in FIG. 2, in some embodiments, various gate electrodes present in the spin qubit device assembly 200 may be electrically isolated from one another using any suitable insulating spacer material, such as a carbon-doped oxide, silicon nitride, silicon oxide, or other carbides or nitrides (e.g., silicon carbide, silicon nitride doped with carbon, and silicon oxynitride).

In the embodiment shown in FIG. 2, the gate dielectric 204 for all of the gates, i.e. for the gate electrodes 206 and 212, is provided by a common layer of gate dielectric material disposed between the dopant atom stack 203 and each of the gate electrodes 206, 212. However, in other embodiments, the gate dielectric 204 for each of the gates present in the spin qubit device assembly 200 may be provided by separate/individual portions of the gate dielectric 204. In some embodiments, the gate dielectric 204 may be a multilayer gate dielectric (e.g., with multiple materials used to improve the interface between the stack 203 and the corresponding gate metal of the gate electrode 206/212). The gate dielectric 204 may be, for example, silicon oxide, aluminum oxide, or a high-k dielectric, such as hafnium oxide. More generally, the gate dielectric 204 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 204 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 204 to improve the quality of the gate dielectric 204. In various embodiments, a thickness of the gate dielectric 204 used with any of the gate electrodes present in the spin qubit device assembly 200 may be between about 0.5 and 10 nanometers, including all values and ranges therein, e.g. between about 1 and 5 nanometers, or between about 2 and 4 nanometers.

The gate electrodes 206, 212 may include any suitable metal used in dopant-based spin qubits. In some embodiments, the gate metal of the gate electrodes 206, 212 may be a superconductor, such as aluminum, titanium nitride (e.g., deposited via atomic layer deposition), or niobium titanium nitride.

The spin qubit device assembly 200 according to any of the embodiments described herein may be operated using any methods known in the art. In some embodiments, a method of operating a spin qubit device assembly such as the spin qubit device assembly 200 may include providing electrical signals to one or more gates, e.g. to one or more of the gate electrodes 206, 212, above a semiconductor host layer, e.g. the semiconductor host layer 220, as part of controlling a spin state of a first dopant atom, e.g. the dopant atom 210, included in the semiconductor host layer. The method may also include allowing interaction between the first dopant atom and a second dopant atom (not specifically shown in FIGS.) included in the semiconductor host layer, and determining the spin state of the first dopant atom or/and a spin state of the second dopant atom following said interaction.

Turning to the details of the dopant atom stack 203 in which the dopant atom 210 is implanted, FIGS. 3A-3D provide cross-section illustrations of exemplary dopant atom stacks, according to various embodiments of the present disclosure.

Figure 3B:
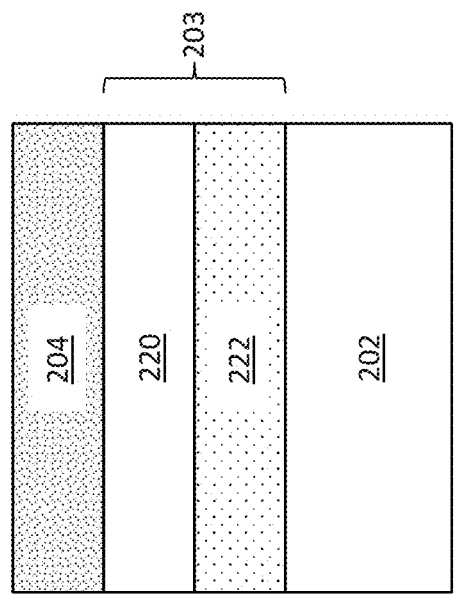
Figure 3A:
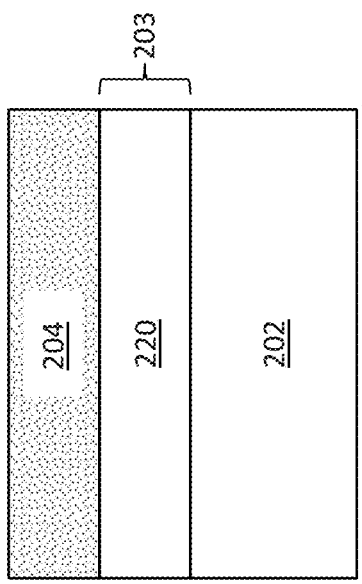

FIG. 3A is a cross-sectional view where the dopant atom stack 203 includes the semiconductor host layer 220 between the substrate 202 and the gate dielectric 204. In the embodiment of FIG. 3A, the semiconductor host layer 220 may be directly on the substrate 202 and the gate dielectric 204 may be directly on the semiconductor host layer 220. Even though FIG. 3A illustrates the gate dielectric 204 as a continuous layer, in other embodiments, the gate dielectric 204 does not have to be continuous, as described above, and may be provided only between whenever one or more gate electrodes are present and the dopant atom stack 203. This also applies to FIGS. 3B-3D.

The substrate 202 may be any substrate suitable for realizing quantum circuit assemblies described herein. In one implementation, the substrate 202 may be a crystalline substrate such as, but not limited to a silicon or a sapphire substrate, and may be provided as a wafer or a portion thereof. In other implementations, the substrate 202 may be non-crystalline. In general, any material that provides sufficient advantages (e.g. sufficiently good electrical isolation and/or ability to apply known fabrication and processing techniques) to outweigh the possible disadvantages (e.g. negative effects of undesired impurities), and that may serve as a foundation upon which a quantum circuit may be built, falls within the spirit and scope of the present disclosure. Additional examples of substrates 202 include silicon-on-insulator (SOI) substrates, III-V substrates, and quartz substrates.

The semiconductor host layer 220 may be formed of a material such that, during operation of the spin qubit device assembly 200 according to any of the embodiments described herein, a single dopant atom implanted in the semiconductor host layer 220, proximate to the upper surface of the semiconductor host layer 220, may form a dopant-based spin qubit. In some embodiments, the semiconductor host layer 220 in which the dopant atoms 104 forming the dopant-based spin qubits 102 are to be implanted may be, or include, an intrinsic (i.e. non-doped or low-doped, where doping is either unintentional or deliberate) epitaxially grown semiconductor layer, e.g. an intrinsic epitaxially grown silicon. In various implementations, this epitaxially grown semiconductor host layer may comprise a semiconductor material that is sufficiently pure so that it can behave as a low-loss insulator at qubits operating temperatures, i.e. either no dopants or sufficiently low-level of dopants. In this context, non-doped or low-doped semiconductor host layer 220 implies a non-conductive semiconductor material at temperatures at which qubits may operate, e.g. very low temperatures. Intrinsic layers may sometimes be accidentally doped with defects due to e.g. the addition of unintentional impurities (e.g., O, residual dopants in the chamber used for epitaxial growth, etc.) or unintentional doping from other regions by diffusion during subsequent thermal processing. Furthermore, sometimes dopants may be deliberately added to materials for reasons such as e.g. thermal or mechanical stability. As long as dopants, whether unintentional or deliberately added, are in amounts that are low enough so that the semiconductor host layer 220 may still be considered low-loss and insulating at low temperatures at which qubits operate, such semiconductor host layer may be referred to as intrinsic or non-doped.

In some embodiments, the semiconductor host layer 220 of the dopant atom stacks 203 disclosed herein may include an isotopically purified material. Reducing presence of isotopes with nonzero nuclear spin in a semiconductor host layer 220 (and/or other layers in a dopant atom stack 203) may improve qubit coherence and thus performance of the spin qubit device assembly. The isotopically purified materials disclosed herein may be grown by centrifuging a precursor material to isolate different isotopes by mass, and then using only the desired isotopes as precursors for growth of the desired material. In some embodiments of the dopant atom stacks 203 disclosed herein, an isotopically purified material (e.g., zinc, cadmium, tellurium, selenium, sulfur, iron, lead, tin, carbon, germanium, silicon, hafnium, zirconium, titanium, strontium, or yttrium, as discussed below) may include greater than 90 atomic-percent of stable isotopes with zero nuclear spin (and less than 10 atomic-percent of isotopes with nonzero nuclear spin).

In some embodiments, the semiconductor host layer 220 of a dopant atom stack 203 may include or be formed of silicon. The silicon may be an isotopically purified silicon, having a lower 29Si content than the natural abundance of 29Si in silicon. For example, in some embodiments, the silicon included in a semiconductor host layer 220 may have a 29Si content that is less than 4 atomic-percent (e.g., less than 3 atomic-percent, less than 2 atomic-percent, less than 1 atomic-percent, or less than 0.1 atomic-percent). In some embodiments, the silicon included in a semiconductor host layer 220 may have a 28Si content that is greater than 93 atomic-percent (e.g., greater than 94 atomic-percent, greater than 95 atomic-percent, greater than 96 atomic-percent, greater than 97 atomic-percent, greater than 98 atomic-percent, or greater than 99 atomic-percent). Embodiments in which the semiconductor host layer 220 is formed of intrinsic silicon may be particularly advantageous for donor-based spin qubit device assemblies 200.

In some embodiments, the semiconductor host layer 220 of a dopant atom stack 203 may include or be formed of germanium. The germanium may be an isotopically purified germanium, having a lower 73Ge content than the natural abundance of 73Ge in silicon. For example, in some embodiments, the germanium included in a semiconductor host layer 220 may have a 73Ge content that is less than 7 atomic-percent (e.g., less than 6 atomic-percent, less than 5 atomic-percent, less than 4 atomic-percent, less than 3 atomic-percent, less than 2 atomic-percent, or less than 1 atomic-percent). In some embodiments, the germanium included in a semiconductor host layer 220 may have a 70Ge content that is greater than 21 atomic-percent (e.g., greater than 90 atomic-percent). In some embodiments, the germanium included in a semiconductor host layer 220 may have a 72Ge content that is greater than 28 atomic-percent (e.g., greater than 90 atomic-percent). In some embodiments, the germanium included in a semiconductor host layer 220 may have a 74Ge content that is greater than 37 atomic-percent (e.g., greater than 90 atomic-percent). In some embodiments, the germanium included in a semiconductor host layer 220 may have a 76Ge content that is greater than 8 atomic-percent (e.g., greater than 90 atomic-percent). Embodiments in which the semiconductor host layer 220 is formed of intrinsic germanium may be particularly advantageous for donor-based spin qubit device assemblies 200. In some embodiments, the semiconductor host layer 220 may include isotopically purified silicon and isotopically purified germanium (e.g., silicon germanium grown from isotopically purified silicon and isotopically purified germanium precursors).

In some embodiments, the semiconductor host layer 220 of a dopant atom stack 203 may include isotopically purified zinc. For example, in some embodiments, the zinc included in a semiconductor host layer 220 may have a 67Zn content that is less than 4 atomic-percent (e.g., less than 3 atomic-percent, less than 2 atomic-percent, or less than 1 atomic-percent). In some embodiments, the zinc included in a semiconductor host layer 220 may have a 64Zn content that is greater than 50 atomic-percent (e.g., greater than 90 atomic-percent). In some embodiments, the zinc included in a semiconductor host layer 220 may have a 66Zn content that is greater than 28 atomic-percent (e.g., greater than 90 atomic-percent).

In some embodiments, the semiconductor host layer 220 of a dopant atom stack 203 may include isotopically purified cadmium. For example, in some embodiments, the cadmium included in a semiconductor host layer 220 may have a 111Cd content that is less than 12 atomic-percent (e.g., less than 10 atomic-percent, less than 5 atomic-percent, or less than 1 atomic-percent). In some embodiments, the cadmium included in a semiconductor host layer 220 may have a 113Cd content that is less than 12 atomic-percent (e.g., less than 10 atomic-percent, less than 5 atomic-percent, or less than 1 atomic-percent). In some embodiments, the cadmium included in a semiconductor host layer 220 may have a 114Cd content that is greater than 29 atomic-percent (e.g., greater than 90 atomic-percent).

In some embodiments, the semiconductor host layer 220 of a dopant atom stack 203 may include isotopically purified tellurium. For example, in some embodiments, the tellurium included in a semiconductor host layer 220 may have a 123Te content that is less than 0.9 atomic-percent (e.g., less than 0.5 atomic-percent). In some embodiments, the tellurium included in a semiconductor host layer 220 may have a 125Te content that is less than 7 atomic-percent (e.g., less than 5 atomic-percent, less than 2 atomic-percent, or less than 1 atomic-percent). In some embodiments, the tellurium included in a semiconductor host layer 220 may have a Te128 content that is greater than 32 atomic-percent (e.g., greater than 90 atomic-percent). In some embodiments, the tellurium included in a semiconductor host layer 220 may have a Te130 content that is greater than 35 atomic-percent (e.g., greater than 90 atomic-percent).

In some embodiments, the semiconductor host layer 220 of a dopant atom stack 203 may include isotopically purified selenium. For example, in some embodiments, the selenium included in a semiconductor host layer 220 may have a 77Se content that is less than 7 atomic-percent (e.g., less than 5 atomic-percent, less than 2 atomic-percent, or less than 1 atomic-percent). In some embodiments, the selenium included in a semiconductor host layer 220 may have a 78Se content that is greater than 24 atomic-percent (e.g., greater than 90 atomic-percent). In some embodiments, the selenium included in a semiconductor host layer 220 may have an 80Se content that is greater than 50 atomic-percent (e.g., greater than 90 atomic-percent).

In some embodiments, the semiconductor host layer 220 of a dopant atom stack 203 may include isotopically purified sulfur. For example, in some embodiments, the sulfur included in a semiconductor host layer 220 may have a 33S content that is less than 0.8 atomic-percent (e.g., less than 0.5 atomic-percent, less than 0.2 atomic-percent, or less than 0.1 atomic-percent). In some embodiments, the sulfur included in a semiconductor host layer 220 may have a 32S content that is greater than 95 atomic-percent.

In some embodiments, the semiconductor host layer 220 of a dopant atom stack 203 may include isotopically purified iron. For example, in some embodiments, the iron included in a semiconductor host layer 220 may have a 57Fe content that is less than 2 atomic-percent (e.g., less than 1 atomic-percent, or less than 0.5 atomic-percent). In some embodiments, the iron included in a semiconductor host layer 220 may have a 56Fe content that is greater than 92 atomic-percent.

In some embodiments, the semiconductor host layer 220 of a dopant atom stack 203 may include isotopically purified lead. For example, in some embodiments, the lead included in a semiconductor host layer 220 may have a 207Pb content that is less than 22 atomic-percent (e.g., less than 10 atomic-percent, less than 2 atomic-percent, or less than 1 atomic-percent). In some embodiments, the lead included in a semiconductor host layer 220 may have a 208Pb content that is greater than 53 atomic-percent (e.g., greater than 90 atomic-percent).

In some embodiments, the semiconductor host layer 220 of a dopant atom stack 203 may include isotopically purified tin. For example, in some embodiments, the tin included in a semiconductor host layer 220 may have a 119Sn content that is less than 8 atomic-percent (e.g., less than 5 atomic-percent, less than 2 atomic-percent, or less than 1 atomic-percent). In some embodiments, the tin included in a semiconductor host layer 220 may have a 117Sn content that is less than 7 atomic-percent (e.g., less than 5 atomic-percent, less than 2 atomic-percent, or less than 1 atomic-percent). In some embodiments, the tin included in a semiconductor host layer 220 may have a 115Sn content that is less than 0.3 atomic-percent (e.g., less than 0.2 atomic-percent). In some embodiments, the tin included in a semiconductor host layer 220 may have a 120Sn content that is greater than 33 atomic-percent (e.g., greater than 90 atomic-percent). In some embodiments, the tin included in a semiconductor host layer 220 may have a 118Sn content that is greater than 25 atomic-percent (e.g., greater than 90 atomic-percent).

In some embodiments, the semiconductor host layer 220 of a dopant atom stack 203 may include isotopically purified carbon. For example, in some embodiments, the carbon included in a semiconductor host layer 220 may have a 13C content that is less than 1 atomic-percent (e.g., less than 0.5 atomic-percent, or less than 0.2 atomic-percent. In some embodiments, the carbon included in a semiconductor host layer 220 may have a 12C content that is greater than 99 atomic-percent.

In some embodiments, material layers that are adjacent or proximate to the semiconductor host layer 220 (e.g., other layers in a dopant atom stack 203 or outside the dopant atom stack 203) may also include an isotopically purified material to reduce electron spin dephasing in the semiconductor host layer 220 induced by nuclear spins outside the semiconductor host layer 220.

In some embodiments, the gate dielectric 204 (e.g., the gate dielectric 204 shown in FIG. 2 or in FIGS. 3A-3D) may include an isotopically purified material. For example, the gate dielectric 204 may include isotopically purified silicon (e.g., in accordance with any of the embodiments discussed above). In some embodiments, the gate dielectric 204 may include oxygen and isotopically purified silicon (e.g., as silicon oxide). In another example, the gate dielectric 204 may include isotopically purified germanium (e.g., in accordance with any of the embodiments discussed above). In some embodiments, the gate dielectric 204 may include oxygen and isotopically purified germanium (e.g., as germanium oxide).

In some embodiments, the gate dielectric 204 may include isotopically purified hafnium. For example, the hafnium included in a gate dielectric 204 may have a 177Hf content that is less than 18 atomic-percent (e.g., less than 10 atomic-percent, less than 5 atomic-percent, or less than 1 atomic-percent). In some embodiments, the hafnium included in a gate dielectric 204 may have a 179Hf content that is less than 13 atomic-percent (e.g., less than 10 atomic-percent, less than 5 atomic-percent, or less than 1 atomic-percent). In some embodiments, the hafnium included in a gate dielectric 204 may have a 178Hf content that is greater than 28 atomic-percent (e.g., greater than 90 atomic-percent). In some embodiments, the hafnium included in a gate dielectric 204 may have a 180Hf content that is greater than 36 atomic-percent. In some embodiments, the gate dielectric 204 may include oxygen and isotopically purified hafnium (e.g., as hafnium oxide) (e.g., greater than 90 atomic-percent).

In some embodiments, the gate dielectric 204 may include isotopically purified zirconium. For example, the zirconium included in a gate dielectric 204 may have a 91Zr content that is less than 11 atomic-percent (e.g., less than 10 atomic-percent, less than 5 atomic-percent, or less than 1 atomic-percent). In some embodiments, the zirconium included in a gate dielectric 204 may have a 90Zr content that is greater than 52 atomic-percent. In some embodiments, the gate dielectric 204 may include oxygen and isotopically purified zirconium (e.g., as zirconium oxide).

In some embodiments, the gate dielectric 204 may include isotopically purified titanium. For example, the titanium included in a gate dielectric 204 may have a 47Ti content that is less than 7 atomic-percent (e.g., less than 5 atomic-percent, less than 2 atomic-percent, or less than 1 atomic-percent). In some embodiments, the titanium included in a gate dielectric 204 may have a 49Ti content that is less than 5 atomic-percent (e.g., less than 2 atomic-percent, or less than 1 atomic-percent). In some embodiments, the titanium included in a gate dielectric 204 may have a 48Ti content that is greater than 74 atomic-percent (e.g., greater than 90 atomic-percent). In some embodiments, the gate dielectric 204 may include oxygen and isotopically purified titanium (e.g., as titanium oxide).

In some embodiments, the gate dielectric 204 may include isotopically purified strontium. For example, the strontium included in a gate dielectric 204 may have an 87Sr content that is less than 7 atomic-percent (e.g., less than 5 atomic-percent, less than 2 atomic-percent, or less than 1 atomic-percent). In some embodiments, the strontium included in a gate dielectric 204 may have a 88Sr content that is greater than 83 atomic-percent (e.g., greater than 90 atomic-percent). In some embodiments, the gate dielectric 204 may include oxygen and isotopically purified strontium (e.g., as strontium oxide).

In some embodiments, the gate dielectric 204 may include isotopically purified yttrium. For example, the yttrium included in a gate dielectric 204 may have a 171Y content that is less than 14 atomic-percent (e.g., less than 10 atomic-percent, less than 5 atomic-percent, or less than 1 atomic-percent). In some embodiments, the yttrium included in a gate dielectric 204 may have a 173Y content that is less than 16 atomic-percent (e.g., less than 10 atomic-percent, less than 5 atomic-percent, or less than 1 atomic-percent). In some embodiments, the yttrium included in a gate dielectric 204 may have a 174Y content that is greater than 32 atomic-percent (e.g., greater than 90 atomic-percent). In some embodiments, the yttrium included in a gate dielectric 204 may have a 172Y content that is greater than 22 atomic-percent (e.g., greater than 90 atomic-percent). In some embodiments, the gate dielectric 204 may include oxygen and isotopically purified yttrium (e.g., as yttrium oxide).

FIG. 3B illustrates that, in some embodiments, the dopant atom stack 203 may include not only the semiconductor host layer 220 but also a buffer layer 222. Such a buffer layer may be provided between the substrate 202 and the semiconductor host layer 220. For example, in some embodiments, the buffer layer 222 may be provided directly on the substrate 202, and the semiconductor host layer 220 may be provided directly on the buffer layer 222. The gate dielectric 204 may then be provided directly on the semiconductor host layer 220, as shown in FIG. 3B. The buffer layer 222 may be formed of the same material as the semiconductor host layer 220, and may be present to trap defects that form in this material as it is grown on the substrate 202. In some embodiments, the semiconductor host layer 220 may be formed of isotopically purified silicon, and the buffer layer 222 may be formed of intrinsic silicon. In some embodiments, the semiconductor host layer 220 may be formed of isotopically purified germanium, and the buffer layer 222 may be formed of intrinsic germanium. In some embodiments, the buffer layer 222 may be grown under different conditions (e.g., deposition temperature or growth rate) from the semiconductor host layer 220. In particular, the semiconductor host layer 220 may be grown under conditions that achieve fewer defects than in the buffer layer 222. In some embodiments in which the buffer layer 222 includes silicon germanium, the silicon germanium of the buffer layer 222 may have a germanium content that varies from the substrate 202 to the semiconductor host layer 220; for example, the silicon germanium of the buffer layer 222 may have a germanium content that varies from zero percent at the substrate to a nonzero percent (e.g., 30 atomic-percent) at the semiconductor host layer 220.

As noted above, it may be advantageous for materials that are adjacent or proximate to the semiconductor host layer 220 to include isotopically purified materials to reduce electron spin dephasing. Thus, in some embodiments, at least the upper portion of the buffer layer 222 (e.g., the upper 50 nanometers to 500 nanometers of the buffer layer 222) may include an isotopically purified material (e.g., isotopically purified silicon or germanium, or any other isotopically purified materials described above with reference to the semiconductor host layer 220).

FIG. 3C is a cross-sectional view of an arrangement including a substrate 202, a dopant atom stack 203, and a gate dielectric 204. The dopant atom stack 203 of FIG. 3C may include a buffer layer 222, a barrier layer 224-1, a semiconductor host layer 220, and an additional barrier layer 224-2. The barrier layer 224-1 may provide a potential barrier between the semiconductor host layer 220 and the buffer layer 222, while the barrier layer 224-2 may provide a potential barrier between the semiconductor host layer 220 and the gate dielectric 204. In some embodiments of the dopant atom stack 203 shown in FIG. 3C, the barrier layers 224 may include an isotopically purified material, such as any of the materials discussed above with reference to the semiconductor host layer 220. For example, the portions of the barrier layers 224 adjacent to the semiconductor host layer 220 (e.g., the 25 nanometers to 100 nanometers of the barrier layers 224 closest to the semiconductor host layer 220) may include an isotopically purified material (while the remainder of the barrier layers 224 may or may not include an isotopically purified material). In the embodiment of FIG. 3C, the buffer layer 222 and/or the gate dielectric 204 may or may not include an isotopically purified material; more generally, the buffer layer 222 and/or the gate dielectric 204 of FIG. 3C may take the form of any suitable ones of the embodiments disclosed herein. In some embodiments in which the semiconductor host layer 220 includes silicon or germanium, the barrier layers 224 may include silicon germanium (e.g., isotopically purified silicon and isotopically purified germanium). The germanium content of this silicon germanium may be between 20 atomic-percent and 80 atomic-percent (e.g., between 30 atomic-percent and 70 atomic-percent).

In some embodiments of the arrangement of FIG. 3C, the buffer layer 222 and the barrier layer 224-1 may be formed of silicon germanium. In some such embodiments, the silicon germanium of the buffer layer 222 may have a germanium content that varies from the substrate 202 to the barrier layer 224-1; for example, the silicon germanium of the buffer layer 222 may have a germanium content that varies from zero percent at the substrate to a nonzero percent (e.g., between 30 atomic-percent and 70 atomic-percent) at the barrier layer 224-1. The barrier layer 224-1 may in turn have a germanium content equal to the nonzero percent. In other embodiments, the buffer layer 222 may have a germanium content equal to the germanium content of the barrier layer 224-1 but may be thicker than the barrier layer 224-1 to absorb the defects that arise during growth. In some embodiments of the dopant atom stack 203 of FIG. 3C, the barrier layer 224-2 may be omitted. In other embodiments of the dopant atom stack 203 of FIG. 3C, the barrier layer 224-1 may be omitted. In still other embodiments of the dopant atom stack 203 of FIG. 3C, the buffer layer 222 may be omitted. In further such embodiments, one of the barrier layer 224-1 or the barrier layer 224-2 may also be omitted.

FIG. 3D is a cross-sectional view of another example dopant atom stack 203 on an example substrate 202, with a gate dielectric 204 on the dopant atom stack 203. The dopant atom stack 203 of FIG. 3D may include an insulating layer 226 on the substrate 202, a semiconductor host layer 220 on the insulating layer 226, and a barrier layer 224 on the semiconductor host layer 220. The presence of the insulating layer 226 may help confine carriers to the semiconductor host layer 220, providing high valley splitting during operation.

The insulating layer 226 may include any suitable electrically insulating material. For example, in some embodiments, the insulating layer 226 may be an oxide (e.g., silicon oxide or hafnium oxide). In some embodiments, to improve qubit coherence in the semiconductor host layer 220, the insulating layer 226 may include an isotopically purified material (e.g., any of the materials discussed above with reference to the gate dielectric 204). The substrate 202, the semiconductor host layer 220, and the barrier layer 224 of FIG. 3D may take the form of any of the embodiments disclosed herein. In some embodiments, the semiconductor host layer 220 may be formed on the insulating layer 226 by a layer transfer technique. In some embodiments, the barrier layer 224 may be omitted from the dopant atom stack 203 of FIG. 3D.

The thicknesses (i.e., z-heights) of the layers in the dopant atom stacks 203 of FIGS. 3A-3D may take any suitable values. For example, in some embodiments, the thickness of the semiconductor host layer 220 may be between about 5 nanometers and 15 nanometers, including all values and ranges therein, e.g. approximately equal to 10 nanometers. In some embodiments, the thickness of a buffer layer 222 may be between about 0.3 microns and 4 microns, including all values and ranges therein, e.g. between about 0.3 microns and 2 microns, or approximately 0.5 microns. In some embodiments, the thickness of the barrier layers 224 may be between about 0 nanometers and 300 nanometers, including all values and ranges therein. In some embodiments, the thickness of the insulating layer 226 in the dopant atom stack 203 of FIG. 3D may be between about 5 nanometers and 200 nanometers, including all values and ranges therein.

Figure 4:
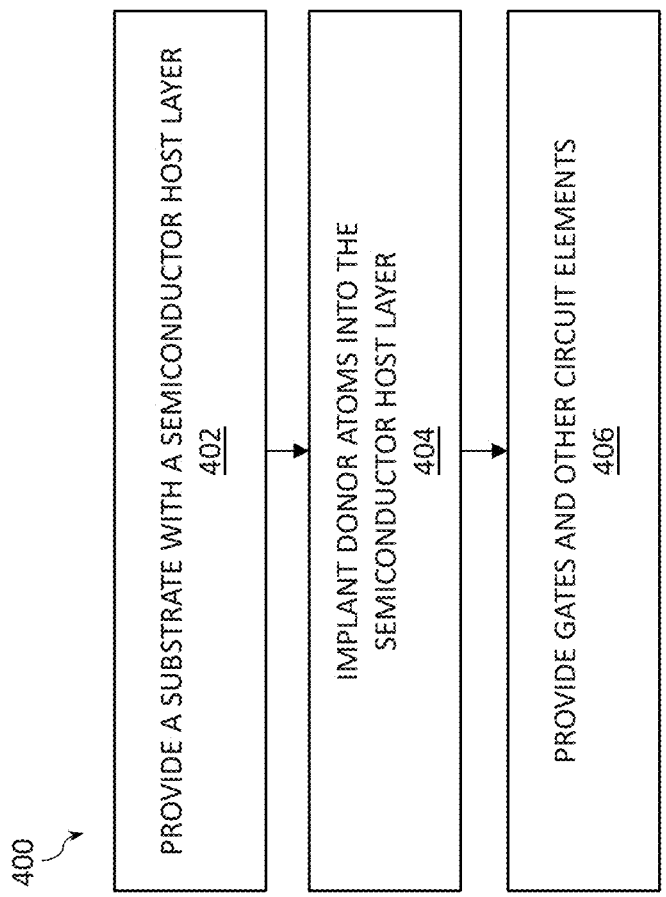
FIG. 4 provides a flow chart of a method for fabricating dopant-based spin qubit quantum circuit assemblies, according to some embodiments of the present disclosure.
Figure 5A:
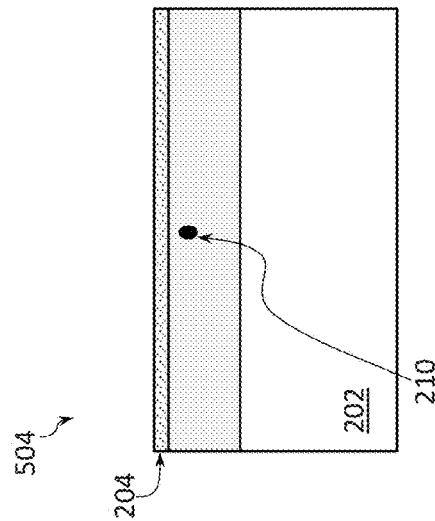
FIGS. 5A-5C are various views illustrating different exemplary stages in the manufacture of a quantum circuit assembly using the method of FIG. 4, in accordance with some embodiments of the present disclosure.
Figure 5B:
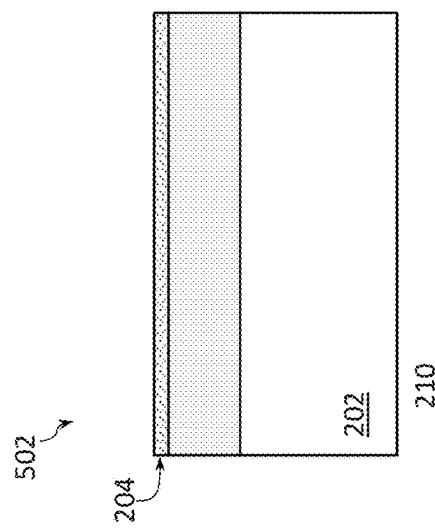
Figure 5C:
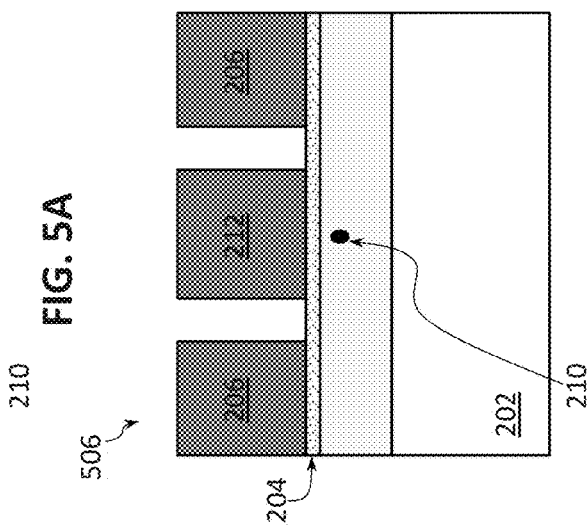

Methods for Fabricating Dopant-based Spin Qubits with Isotopically Purified Materials Spin qubit device assemblies with isotopically purified materials as described herein may be fabricated/manufactured using any suitable methods. One exemplary method is shown in FIG. 4 as a method 400, according to some embodiments of the present disclosure. FIGS. 5A-5C provide various views illustrating different exemplary stages in the manufacture of a spin qubit device assembly using the method of FIG. 4, in accordance with some embodiments of the present disclosure.

Various operations of the method 400 may be illustrated with reference to some specific exemplary embodiments discussed above, but the method 400 may be used to manufacture any suitable spin qubit device assemblies with dopant-based spin qubits as described herein. Although the operations of the method 400 are illustrated in FIG. 4 once each and in a particular order, the operations may be performed in any suitable order and repeated as desired. For example, one or more operations may be performed in parallel to manufacture multiple spin qubit device assemblies as described herein substantially simultaneously. In another example, the operations may be performed in a different order to reflect the architecture of a particular quantum circuit component in which one or more spin qubit device assemblies with dopant-based spin qubits in accordance with any of the embodiments described herein are to be included. In addition, the manufacturing method 400 may include other operations, not specifically shown in FIG. 4, such as e.g. various cleaning operations as known in the art. For example, in some embodiments, spin qubit device assemblies may be cleaned prior to or/and after any of the processes of the method 400 described herein, e.g. to remove surface-bound oxide, organic, and/or metallic contaminants, as well as subsurface contamination. In some embodiments, cleaning may be carried out using e.g. a chemical solutions (such as peroxide), and/or with ultraviolet (UV) radiation combined with ozone, and/or oxidizing the surface (e.g., using thermal oxidation) then removing the oxide (e.g. using hydrofluoric acid (HF)).

The method 400 may begin with a process 402 in which a substrate with a semiconductor host layer may be provided. The semiconductor host layer provided in the process 402 may be included within a stack of layers provided over the substrate, and may take the form of the semiconductor host layer 220 included in any of the dopant atom stacks 203 described herein. A result of performing the process 402 is illustrated with a spin qubit device assembly 502 shown in FIG. 5A, illustrating a dopant atom stack 203 provided on a substrate 202, with a gate dielectric 204 provided over the dopant atom stack 203, according to any of the embodiments described herein. Any suitable techniques may be used for providing the dopant atom stack 203 in the process 402, such as e.g. any suitable epitaxial growth techniques, some of which are described above. In order to include isotopically purified materials into any of the layers of the dopant atom stack 203 or the gate dielectric 204, suitable precursor materials may be used. In some embodiments, isotopically purified materials disclosed herein may be grown by centrifuging a precursor material to isolate different isotopes by mass, and then using only the desired isotopes as precursors for growth of the desired material as a part of forming the dopant atom stack 203 and/or the gate dielectric 204. In some embodiments, various layer of the dopant atom stack 203 may be grown using epitaxial growth techniques. In some embodiments, gate dielectrics as described herein can be grown via a process such as e.g. ALD. In general, any growth technique that can use isotopically purified materials in liquid, gas, or solid form can be utilized to form various quantum circuit assemblies described herein.

In a process 404 of the method 400, donor implantation may be carried out, where one or more dopant atoms are implanted into the semiconductor host layer 220 of the dopant atom stack 203 provided in the process 402. The dopant implantation carried out in the process 404 may result in implanting the dopant atom 210 according to any embodiments described herein. A result of performing the process 404 is illustrated with a spin qubit device assembly 504 shown in FIG. 5B, illustrating the dopant atom 210 being implanted in the dopant atom stack 203, according to any of the embodiments described herein.

In a process 406 of the method 400, one or more gates and other circuit elements may be provided over the dopant atom stack provided in the process 402. The gates provided in the process 406 may take the form of any of the gate electrodes, e.g. gate electrodes 206, 212, provided over a gate dielectric, e.g. the gate dielectric 204, described herein. A result of performing the process 406 is illustrated with a spin qubit device assembly 506 shown in FIG. 5C, providing an illustration similar to that shown in FIG. 2 (therefore, all descriptions provided with respect to FIG. 2 are applicable to FIG. 5C). Any suitable techniques may be used for providing various gate electrodes in the process 406, such as atomic layer deposition (ALD), physical vapor deposition (PVD) (e.g. evaporative deposition, magnetron sputtering, or e-beam deposition), chemical vapor deposition (CVD), or electroplating.

Although not specifically shown in FIG. 4, the method 400 may further include additional processes for fabricating any of the spin qubit device assemblies described herein. For example, the method 400 may further include processes for providing insulating spacer materials between various gate electrodes, as described herein.

Exemplary Qubit Devices

Dopant-based spin qubit device assemblies/structures with isotopically purified materials as described above may be included in any kind of qubit devices or quantum processing devices/structures. Some examples of such devices/structures are illustrated in FIGS. 6A-6B, 7, and 8.

Figure 6B:
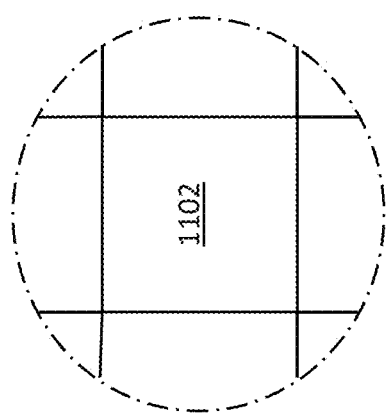
FIGS. 6A and 6B are top views of a wafer and dies that may include one or more of spin qubit device assemblies implementing dopant-based spin qubit devices as described herein, according to some embodiments of the present disclosure.
Figure 6A:
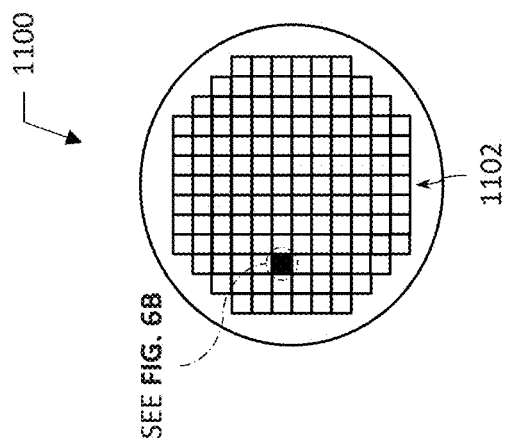

FIGS. 6A-6B are top views of a wafer 1100 and dies 1102 that may be formed from the wafer 1100, according to some embodiments of the present disclosure. The die 1102 may include any of the spin qubit device assemblies with dopant-based spin qubits and isotopically purified materials in accordance with various embodiments described herein, e.g., the spin qubit device assemblies 100/200, any further embodiments of such assemblies as described herein, or any combinations of various embodiments of such assemblies, using various isotopically purified materials as described herein. The wafer 1100 may include semiconductor material and may include one or more dies 1102 having conventional and quantum circuit device elements formed on a surface of the wafer 1100. In particular, the wafer 1100 may include one or more layers or portions of any of the isotopically purified materials described herein, in which dopant atoms are provided. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include one or more spin qubit device assemblies implementing dopant-based spin qubits with isotopically purified materials as described herein, as well as other IC components. In some embodiments, the wafer 1100 or the die 1102 may include a memory device (e.g., a static random access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 8) or other logic that is configured to store information in the memory devices or execute instructions stored in the memory array.

Figure 7:
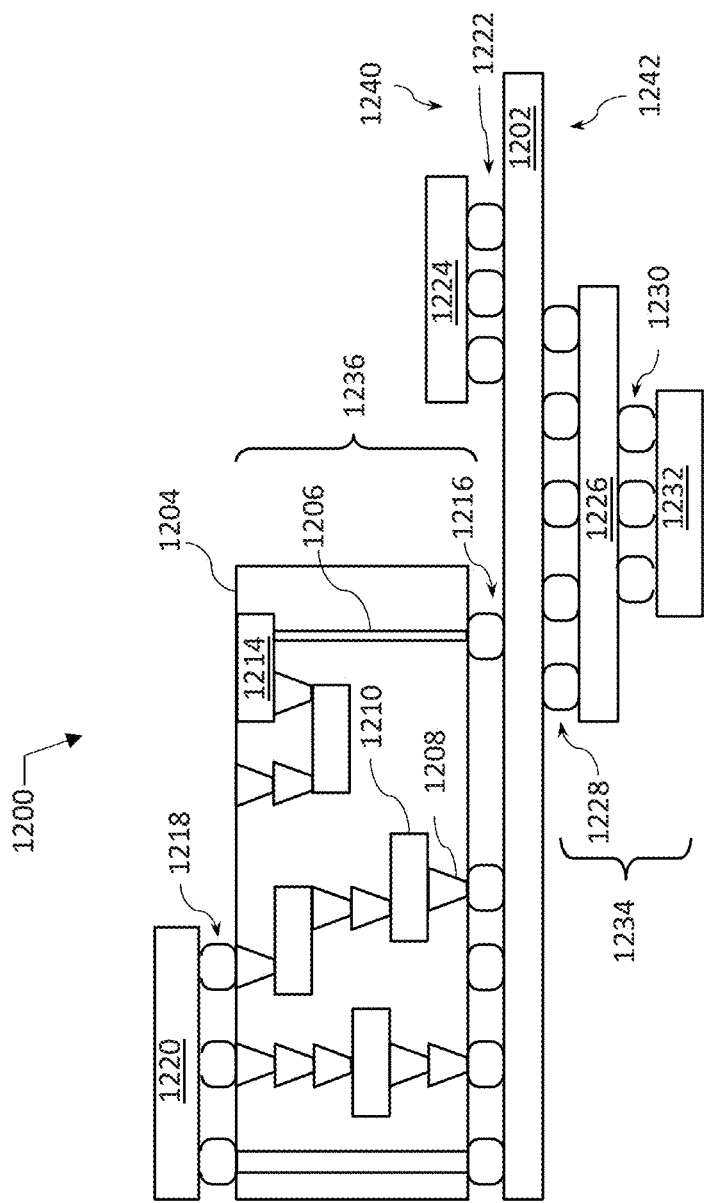
FIG. 7 is a schematic cross-sectional side view of a device assembly that may include one or more of spin qubit device assemblies implementing dopant-based spin qubit devices as described herein, according to some embodiments of the present disclosure.

FIG. 7 is a cross-sectional side view of a device assembly 1200 that may include any of the spin qubit device assemblies implementing dopant-based spin qubits with isotopically purified materials in accordance with various embodiments described herein. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. Signal transfer between components or layer may happen with both low resistance DC connections or by either in-plane or out-of-plane capacitive connections. In other embodiments, the circuit board 1202 may be a package substrate or flexible board.

The IC device assembly 1200 illustrated in FIG. 7 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 7), male and female portions of a socket, an adhesive, an underfill material, and/or any other suitable electrical and/or mechanical coupling structure(s). The coupling components 1216 may include other forms of electrical connections that may have no mechanical contact, such as parallel-plate capacitors or inductors, which can allow high-frequency connection between components without mechanical or DC connection.

The package-on-interposer structure 1236 may include a package 1220 coupled to an interposer 1204 by coupling components 1218. The coupling components 1218 may take any suitable form for the application, such as the forms discussed above with reference to the coupling components 1216. Although a single package 1220 is shown in FIG. 7, multiple packages may be coupled to the interposer 1204; indeed, additional interposers may be coupled to the interposer 1204. The interposer 1204 may provide an intervening substrate used to bridge the circuit board 1202 and the package 1220. In some implementations, the package 1220 may be a quantum circuit device package as described herein, e.g. a package including one or more dies with any of the spin qubit device assemblies with dopant-based spin qubits in accordance with various embodiments described herein, e.g., the spin qubit device assemblies 100/200, any further embodiments of such assemblies as described herein, or any combinations of various embodiments of such assemblies. In other implementations, the package 1220 may be a conventional IC package with non-quantum circuit assemblies. Generally, the interposer 1204 may spread a connection to a wider pitch or reroute a connection to a different connection. For example, the interposer 1204 may couple the package 1220 (e.g., a die) to a ball grid array (BGA) of the coupling components 1216 for coupling to the circuit board 1202. In the embodiment illustrated in FIG. 7, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of a crystalline material, such as silicon, germanium, or other semiconductors, an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1210 and vias 1208, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. Thus, the package 1224 may be a package including one or more quantum circuits or assemblies implementing dopant-based spin qubits in accordance with any of the embodiments described herein or may be a conventional IC package, for example.

The device assembly 1200 illustrated in FIG. 7 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package that includes one or more dopant-based spin qubit assemblies as described herein or may be a conventional IC package, for example. In some embodiments, one or both of the packages 1226 and 1232 may take the form of any of the embodiments of the spin qubit device assemblies implementing dopant-based spin qubits in accordance with various embodiments described herein.

Figure 8:
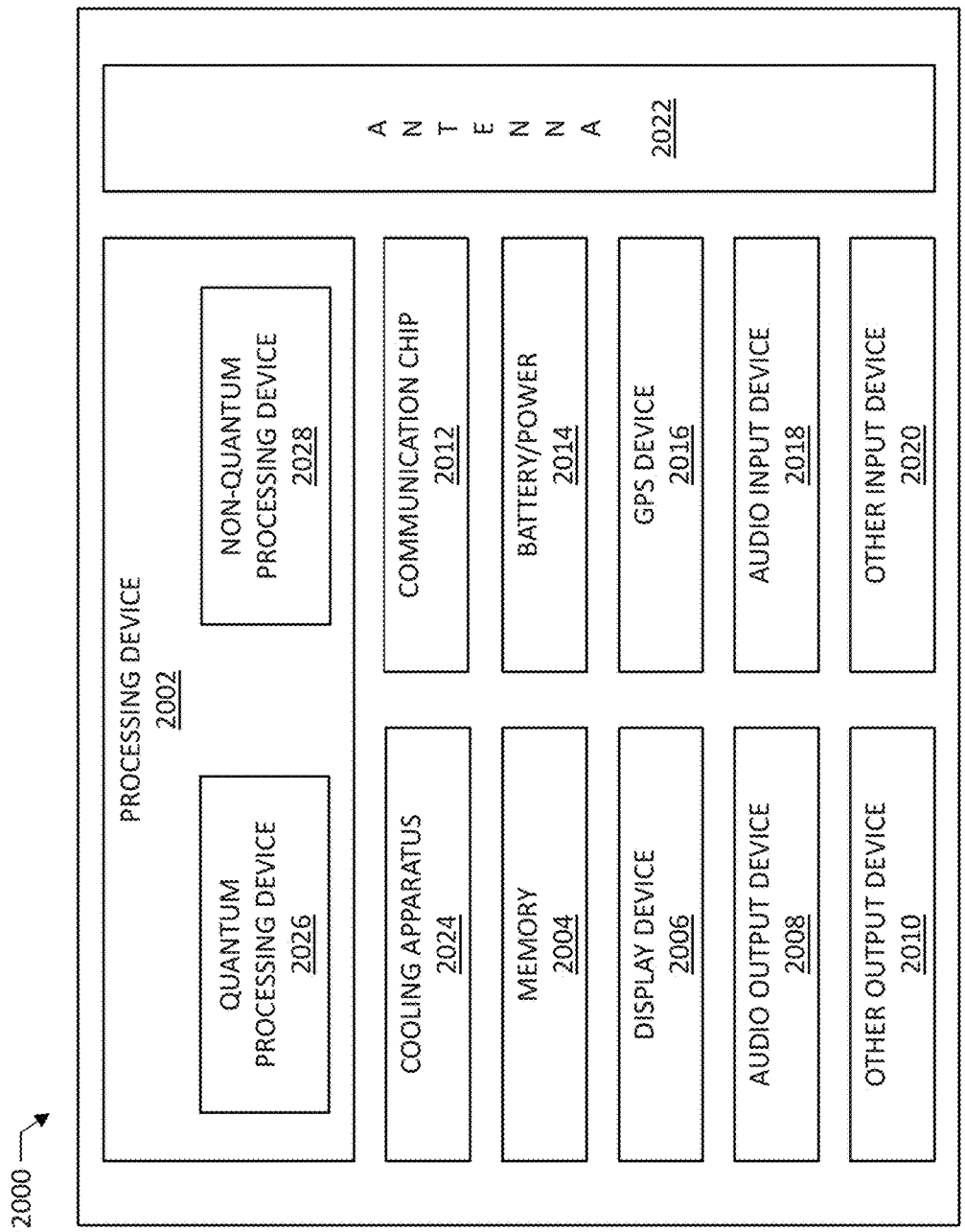
FIG. 8 is a block diagram of an exemplary quantum computing device that may include one or more of spin qubit device assemblies implementing dopant-based spin qubit devices as described herein, according to some embodiments of the present disclosure.

FIG. 8 is a block diagram of an exemplary quantum computing device 2000 that may include one or more of spin qubit device assemblies implementing dopant-based spin qubits with isotopically purified materials in accordance with any of the embodiments described herein. A number of components are illustrated in FIG. 8 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the quantum circuit assemblies described herein. In some embodiments, various ones of these components may be fabricated onto a single system-on-a-chip (SoC) die. Additionally, in various embodiments, the quantum computing device 2000 may not include one or more of the components illustrated in FIG. 8, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled. In further examples, the quantum computing device 2000 may include a microwave input device or a microwave output device (not specifically shown in FIG. 8), or may include microwave input or output device interface circuitry (e.g., connectors and supporting circuitry) to which a microwave input device or microwave output device may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include any of the spin qubit device assemblies with dopant-based spin qubits in accordance with various embodiments described herein, e.g., the spin qubit device assemblies 100/200, any further embodiments of such assemblies as described herein, or any combinations of various embodiments of such assemblies, and may perform data processing by performing operations on the qubits that may be generated in these quantum circuit assemblies, and monitoring the result of those operations. For example, as discussed above, different qubits may be allowed to interact, the quantum states of different qubits may be set or transformed, and the quantum states of different qubits may be read. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-MRAM).

The quantum computing device 2000 may include a cooling apparatus 2024. The cooling apparatus 2024 may maintain the quantum processing device 2026, in particular the quantum circuits/assemblies implementing dopant-based spin qubits as described herein, at a predetermined low temperature during operation to avoid qubit decoherence and to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2024 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

SELECT EXAMPLES

The following paragraphs provide examples of various ones of the embodiments disclosed herein.

Example 1 provides a spin qubit device assembly that includes a dopant atom stack including at least a semiconductor host layer that includes an isotopically purified material; a dopant atom in the semiconductor host layer; a gate metal proximate to the dopant atom; and a gate dielectric between the gate metal and the semiconductor host layer.

Example 2 provides the spin qubit device assembly according to Example 1, where the isotopically purified material includes silicon.

Example 3 provides the spin qubit device assembly according to Example 2, where the silicon includes 29Si in an amount less than 4 atomic-percent.

Example 4 provides the spin qubit device assembly according to Example 2, where the isotopically purified material further includes germanium.

Example 5 provides the spin qubit device assembly according to Example 4, where the germanium includes 73Ge in an amount less than 7 atomic-percent.

Example 6 provides the spin qubit device assembly according to Example 1, where the isotopically purified material includes germanium.

Example 7 provides the spin qubit device assembly according to Example 6, where the germanium includes 73Ge in an amount less than 7 atomic-percent.

Example 8 provides the spin qubit device assembly according to Example 1, where the isotopically purified material includes zinc, cadmium, tellurium, selenium, sulfur, iron, lead, tin, or carbon.

Example 9 provides the spin qubit device assembly according to any of Examples 1-8, where the isotopically purified material is a first isotopically purified material, the dopant atom stack further includes a buffer layer, the buffer layer includes a second isotopically purified material, and the semiconductor host layer is between the buffer layer and the gate dielectric.

Example 10 provides the spin qubit device assembly according to Example 9, where the second isotopically purified material includes zinc, cadmium, tellurium, selenium, sulfur, iron, lead, tin, or carbon.

Example 11 provides the spin qubit device assembly according to Examples 9 or 10, where a thickness of the buffer layer is greater than 25 nanometers.

Example 12 provides the spin qubit device assembly according to any one of Examples 9-11, where the dopant atom stack further includes a barrier layer, the barrier layer includes a third isotopically purified material, and the barrier layer is between the semiconductor host layer and the gate dielectric.

Example 13 provides the spin qubit device assembly according to any one of Examples 9-11, further including a barrier layer, where the buffer layer is between the semiconductor host layer and the barrier layer.

Example 14 provides the spin qubit device assembly according to any of the preceding Examples, where the isotopically purified material is a first isotopically purified material, and the gate dielectric includes a second isotopically purified material.

Example 15 provides the spin qubit device assembly according to Example 14, where the second isotopically purified material includes silicon.

Example 16 provides the spin qubit device assembly according to Example 14, where the second isotopically purified material includes hafnium.

Example 17 provides the spin qubit device assembly according to Example 16, where the hafnium of the second isotopically purified material includes 177Hf in an amount less than 18 atomic-percent.

Example 18 provides the spin qubit device assembly according to Example 14, where the second isotopically purified material includes zirconium, titanium, strontium, or yttrium.

Example 19 provides the spin qubit device assembly according to any one of the preceding Examples, where the gate dielectric is on the semiconductor host layer.

Example 20 provides the spin qubit device assembly according to any one of the preceding Examples, where a thickness of the gate dielectric is between about 0.5 and 10 nanometers, including all values and ranges therein, e.g. between about 1 and 5 nanometers, or between about 2 and 4 nanometers.

Example 21 provides the spin qubit device assembly according to any one of the preceding Examples, further including a radiofrequency, e.g. microwave, transmission line proximate to the dopant atom, e.g. so that a portion of the transmission line is at a distance between about 0 and 2000 nanometers from the dopant atom, e.g. between about 5 and 1000 nanometers or between about 10 and 500 nanometers, and configured to provide an oscillating magnetic field to control a spin state of the dopant-based spin qubit device.

Example 22 provides the spin qubit device assembly according to any one of the preceding Examples, further including a magnetic field source configured to provide a static magnetic field in-plane with the substrate, e.g. a permanent magnet, superconducting magnet, and/or electromagnetic coil.

Example 23 provides a method of operating a spin qubit device assembly, the method including: providing electrical signals to one or more gates above a semiconductor host layer as part of controlling a spin state of a first dopant atom included in the semiconductor host layer, where the semiconductor host layer includes an isotopically purified material; allowing interaction between the first dopant atom and a second dopant atom included in the semiconductor host layer; and determining the spin state of the first dopant atom or/and a spin state of the second dopant atom following the interaction.

Example 24 provides the method according to Example 23, where the one or more gates include a plurality of gates, where adjacent gates of the plurality of gates are spaced apart by a spacer material.

In various further Examples, the spin qubit device assembly in the method according to any one of Examples 23-24 may include the spin qubit device assembly according to any one of the preceding Examples or be included in the quantum IC package according to any one of the Examples below.

Example 25 provides a method of fabricating a spin qubit device assembly, the method including: forming a semiconductor host layer over a substrate, where the semiconductor host layer includes an isotopically purified material; implanting one or more dopant atoms in the semiconductor host layer; and forming one or more gates above the dopant atom stack.

Example 26 provides the method according to Example 25, where forming the one or more gates includes forming a gate dielectric over the semiconductor host layer, where the gate dielectric is between the semiconductor host layer and gate metal of at least one of the one or more gates, and the gate dielectric includes an isotopically purified material.

In various further Examples, the method according to any one of Examples 25-26 may further include processes for fabricating the spin qubit device assembly according to any one of the preceding Examples, or/and processes for fabricating at least portions of the quantum IC package or/and at least portions of the quantum processing device according to any one of Examples below.

Example 27 provides a quantum IC package that includes a qubit die and a further IC element. The qubit die may include a semiconductor host layer that includes an isotopically purified material, and a plurality of dopant-based spin qubit devices, where an individual dopant-based spin qubit device includes a dopant atom in the semiconductor host layer. The further IC element may be coupled to the semiconductor substrate of the qubit die by a plurality of interconnects.

Example 28 provides the quantum IC package according to Example 27, where the qubit die further includes one or more RF lines configured to control a spin state of at least one of the plurality of dopant-based spin qubit devices.

Example 29 provides the quantum IC package according to Examples 27 or 28, where the further IC element is one of an interposer, a circuit board, a flexible board, or a package substrate.

In various further Examples, the qubit die of the quantum IC package according to any one of Examples 27-29 may include the spin qubit device assembly according to any one of the preceding Examples, and at least portions of the quantum IC package may be fabricated according to the method according to any one of the preceding Examples.

In various further Examples, the spin qubit device assembly and/or the quantum IC package according to any one of the preceding Examples may be implemented within any suitable quantum computing device, e.g. as specified in the Examples below.

Example 30 provides a quantum computing device that includes a quantum processing device and a non-quantum processing device. The quantum processing device may include a plurality of dopant-based spin qubit devices, where an individual dopant-based spin qubit device includes a dopant atom in the semiconductor host layer, and where the semiconductor host layer includes an isotopically purified material, and a plurality of gates above the semiconductor host layer to control spin states of the plurality of dopant-based spin qubit devices. The non-quantum processing device may be coupled to the quantum processing device, and may be configured to control voltages applied to one or more of the plurality of gates.

Example 31 provides the quantum computing device of Example 30, further including a memory device to store data generated by the plurality of dopant-based spin qubit devices during operation of the quantum processing device.

Example 32 provides the quantum computing device according to Example 31, where the memory device is configured to store instructions for a quantum computing algorithm to be executed by the quantum processing device.

Example 33 provides the quantum computing device according to any one of Examples 30-32, further including a cooling apparatus configured to maintain a temperature of the quantum processing device below 5 degrees Kelvin.

In various further Examples, the quantum processing device according to any one of Examples 30-33 may include the spin qubit device assembly or the quantum IC package according to any one of the preceding Examples, and at least portions of the quantum processing device may be fabricated according to the method according to any one of the preceding Examples.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A spin qubit device assembly, comprising:
a host layer that includes an isotopically purified material;
a dopant atom in the host layer;
a gate electrode material proximate to the dopant atom; and
a gate dielectric material between the gate electrode material and the host layer, wherein a thickness of the gate dielectric material is between 0.5 and 10 nanometers.

2. The spin qubit device assembly according to claim 1, wherein the isotopically purified material includes silicon.

3. The spin qubit device assembly according to claim 2, wherein the silicon includes 29Si in an amount less than 4 atomic-percent.

4. The spin qubit device assembly according to claim 2, wherein the isotopically purified material further includes germanium.

5. The spin qubit device assembly according to claim 4, wherein the germanium includes 73Ge in an amount less than 7 atomic-percent.

6. The spin qubit device assembly according to claim 1, wherein the isotopically purified material includes germanium.

7. The spin qubit device assembly according to claim 6, wherein the germanium includes 73Ge in an amount less than 7 atomic-percent.

8. The spin qubit device assembly according to claim 1, wherein the isotopically purified material includes zinc, cadmium, tellurium, selenium, sulfur, iron, lead, tin, or carbon.

9. The spin qubit device assembly according to claim 1, wherein the isotopically purified material is a first isotopically purified material, the host layer is a part of a stack, the stack further includes a buffer layer, the buffer layer includes a second isotopically purified material, and the host layer is between the buffer layer and the gate dielectric material.

10. The spin qubit device assembly according to claim 9, wherein the second isotopically purified material includes zinc, cadmium, tellurium, selenium, sulfur, iron, lead, tin, or carbon.

11. The spin qubit device assembly according to claim 9, wherein a thickness of the buffer layer is greater than 25 nanometers.

12. The spin qubit device assembly according to claim 9, wherein the host layer is a part of a stack, the stack further includes a barrier layer, the barrier layer includes a third isotopically purified material, and the barrier layer is between the host layer and the gate dielectric material.

13. The spin qubit device assembly according to claim 9, further comprising a barrier layer, wherein the buffer layer is between the host layer and the barrier layer.

14. The spin qubit device assembly according to claim 1, wherein the isotopically purified material is a first isotopically purified material, and the gate dielectric material includes a second isotopically purified material.

15. The spin qubit device assembly according to claim 14, wherein the second isotopically purified material includes silicon.

16. The spin qubit device assembly according to claim 14, wherein the second isotopically purified material includes hafnium.

17. The spin qubit device assembly according to claim 16, wherein the hafnium of the second isotopically purified material includes 177Hf in an amount less than 18 atomic-percent.

18. The spin qubit device assembly according to claim 14, wherein the second isotopically purified material includes zirconium, titanium, strontium, or yttrium.

19. The spin qubit device assembly according to claim 1, further including a radiofrequency transmission line proximate to the dopant atom and configured to provide an oscillating magnetic field to control a spin state of the dopant atom.

20. The spin qubit device assembly according to claim 1, further including a magnetic field source configured to provide a static magnetic field in-plane with the substrate.

21. A method of operating a spin qubit device assembly, the method comprising:
providing electrical signals to one or more gates above a host layer as part of controlling a spin state of a first dopant atom included in the host layer, wherein the host layer is a part of a stack, the stack further includes a buffer layer, the host layer includes a first isotopically purified material, and at least one of the buffer layer and a gate dielectric material of the one or more gates includes a second isotopically purified material;
allowing interaction between the first dopant atom and a second dopant atom included in the host layer; and
determining the spin state of the first dopant atom or/and a spin state of the second dopant atom following the interaction.

22. The method according to claim 21, wherein the one or more gates include a plurality of gates, wherein adjacent gates of the plurality of gates are spaced apart by a spacer material.

23. A method of fabricating a spin qubit device assembly, the method comprising:
providing a host layer over a substrate, where the host layer includes an isotopically purified material;
implanting one or more dopant atoms in the host layer;
providing one or more gates above the host layer; and
providing a radiofrequency transmission line proximate to the one or more dopant atoms and configured to provide an oscillating magnetic field to control a spin state of the one or more dopant atoms.

24. The method according to claim 23, wherein providing the one or more gates includes providing a gate dielectric material over the host layer, wherein the gate dielectric material is between the host layer and a gate electrode material of at least one of the one or more gates, and the gate dielectric material includes an isotopically purified material.

25. The method according to claim 23, wherein the isotopically purified material is a first isotopically purified material, and wherein the one or more gates include a gate dielectric material that includes a second isotopically purified material.

\* \* \* \* \*